United States Patent
Thorp et al.

(10) Patent No.: US 8,040,721 B2
(45) Date of Patent: Oct. 18, 2011

(54) CREATING SHORT PROGRAM PULSES IN ASYMMETRIC MEMORY ARRAYS

(75) Inventors: Tyler Thorp, Palo Alto, CA (US); Roy E. Scheuerlein, Cupertino, CA (US)

(73) Assignee: SanDisk 3D LLC, Milpitas, CA (US)

( * ) Notice: Subject to any disclaimer, the term of this patent is extended or adjusted under 35 U.S.C. 154(b) by 166 days.

(21) Appl. No.: 12/551,546

(22) Filed: Aug. 31, 2009

(65) Prior Publication Data

US 2011/0051504 A1 Mar. 3, 2011

(51) Int. Cl.
*G11C 11/00* (2006.01)
(52) U.S. Cl. ......... 365/163; 365/148; 365/229; 365/207
(58) Field of Classification Search ............... 365/163, 365/148, 229, 207, 230.06, 189.16
See application file for complete search history.

(56) References Cited

U.S. PATENT DOCUMENTS

| | | | |
|---|---|---|---|
| 5,737,259 | A | 4/1998 | Chang |
| 5,982,659 | A | 11/1999 | Irrinki et al. |
| 6,191,972 | B1 | 2/2001 | Miura et al. |
| 6,545,898 | B1 | 4/2003 | Scheuerlein |
| 6,618,295 | B2 | 9/2003 | Scheuerlein |
| 6,625,054 | B2 | 9/2003 | Lowrey et al. |
| 6,822,903 | B2 | 11/2004 | Scheuerlein et al. |
| 6,963,504 | B2 | 11/2005 | Scheuerlein et al. |
| 7,577,024 | B2 | 8/2009 | Fackenthal et al. |
| 7,813,167 | B2 * | 10/2010 | Porter .................. 365/163 |
| 2006/0166455 | A1 | 7/2006 | Gordon |
| 2009/0052227 | A1 | 2/2009 | Edahiro |
| 2009/0207647 | A1 | 8/2009 | Maejima |

FOREIGN PATENT DOCUMENTS

WO WO 2008-013619 1/2008

OTHER PUBLICATIONS

Thorp et al., U.S. Appl. No. 12/551,548, filed Aug. 31, 2009.
Thorp et al., U.S. Appl. No. 12/551,553, filed Aug. 31, 2009.
International Search Report and Written Opinion of related International Application No. PCT/US2010/045684 Jan. 31, 2011.

(Continued)

*Primary Examiner* — David Lam
(74) *Attorney, Agent, or Firm* — Dugan & Dugan, PC

(57) ABSTRACT

The present invention provides methods and apparatus for adjusting voltages of bit and word lines to create short programming pulses to program a memory cell. The invention may include setting a first line connected to a memory cell to a first voltage from a first line standby voltage, charging a second line connected to the memory cell to a predetermined voltage from a second line standby voltage, switching the first line from the first voltage to a second voltage, and switching the first line from the second voltage to the first voltage. The voltage difference between the first voltage and the predetermined voltage is such that a safe voltage results that does not program the memory cell. A voltage difference between the second voltage and the predetermined voltage is such that a programming voltage operative to program the memory cell results. The switching operations together may create a first pulse.

104 Claims, 7 Drawing Sheets

OTHER PUBLICATIONS

Partial International Search of related International Application No. PCT/US2010/045684 Annex to invitation to pay additional fees dated Nov. 18, 2010.

Lee et al., "A 90nm 1.8V 512Mb Diode-Switch PRAM with 266MB/s Read Throughput", Feb. 14, 2007; 2007 IEEE International Solid-State Circuits Conference, Session 26/Non-Volatile Memories/26.1, pp. 472, 473 and 616.

Hanzawa et al., "A 512kB Embedded Phase Change Memory with 416kB/s Write Throughput at 100μA Cell Write Current", 2007 IEEE International Solid-State Circuits Conference, Session 26/Non-Volatile Memories/26.2, pp. 474, 475 and 616.

Office Action of U.S. Appl. No. 12/551,548 mailed Jan. 6, 2011.

Apr. 5, 2011 Reply to Jan. 6, 2011 Office Action of related U.S. Appl. No. 12/551,548.

Notice of Allowance of related U.S. Appl. No. 12/551,548 mailed May 23, 2011.

* cited by examiner

CREATING SHORT PROGRAM PULSES IN ASYMMETRIC MEMORY ARRAYS

CROSS REFERENCE TO RELATED APPLICATIONS

The present application is related to the following patent applications, which are hereby incorporated by reference herein in their entirety for all purposes:

U.S. patent application Ser. No. 12/551,548, filed Aug. 31, 2009, and entitled "REDUCING PROGRAMMING TIME OF A MEMORY CELL"; and U.S. patent application Ser. No. 12/551,548, filed Aug. 31, 2009, and entitled "FLEXIBLE MULTI-PULSE SET OPERATION FOR PHASE-CHANGE MEMORIES".

FIELD OF THE INVENTION

The present invention relates generally to integrated circuits containing memory arrays, and more particularly, to creating short program pulses in such arrays.

BACKGROUND OF THE INVENTION

Program pulses may be used to program a memory cell. In using program pulses, shorter (and faster) program pulses may be desirable. The maximum speed (and minimum duration) of such pulses may be improved by using better quality metals for bit lines and word lines leading to memory cells, shortening the length of the bit lines, and adding switches to memory arrays to reduce capacitance on the bit lines. However, these previous approaches may not be possible or desirable for all types of memory arrays including 3D memory arrays (e.g., diode matrix arrays). Thus, what are needed are methods and apparatus for creating short program pulses in memory arrays.

SUMMARY OF THE INVENTION

In a first aspect of the invention, a method of programming a two terminal memory cell may be provided. The method may include setting a first line connected to the memory cell to a first voltage from a first line standby voltage, charging a second line connected to the memory cell to a predetermined voltage from a second line standby voltage, switching the first line from the first voltage to a second voltage, and switching the first line from the second voltage to the first voltage. The voltage difference between the first voltage and the predetermined voltage is such that a safe voltage results that does not program the memory cell. The voltage difference between the second voltage and the predetermined voltage is such that a programming voltage operative to program the memory cell results. The switching operations together may create a first pulse.

In a second aspect of the invention, a method of programming a two terminal memory cell, may be provided. The method may include setting a first line connected to the memory cell to a first voltage from a first line standby voltage; charging a second line connected to the memory cell to a predetermined voltage from a second line standby voltage; switching the first line connected to the memory cell from the first voltage to a second voltage; determining whether the memory cell has successfully programmed; and switching the first line connected to the memory cell from the second voltage to the first voltage in response to the determining operation. The voltage difference between the first voltage and the predetermined voltage is such that a safe voltage results that does not program the memory cell. The voltage difference between the second voltage and the predetermined voltage is such that a programming voltage operative to program the memory cell results. The switching operations together may create a first pulse.

In a third aspect of the invention, a method of programming a two terminal memory cell may be provided. The method may include connecting to a control circuit, a first line connected to the memory cell; setting via the control circuit the first line to a first voltage from a first line standby voltage; connecting to a sense amplifier, a second line connected to the memory cell; charging via the sense amplifier the second line to a predetermined voltage from a second line standby voltage; switching via the control circuit the first line connected to the memory cell from the first voltage to a second voltage; and switching via the control circuit the first line connected to the memory cell from the second voltage to the first voltage. The voltage difference between the first voltage and the predetermined voltage is such that a safe voltage results that does not program the memory cell. The voltage difference between the second voltage and the predetermined voltage is such that a programming voltage operative to program the memory cell results. The switching operations together may create a first pulse.

In a fourth aspect of the invention, a method of programming a two terminal memory cell may be provided. The method may include connecting to a control circuit, a first line connected to the memory cell; setting via the control circuit the first line to a first voltage from a first line standby voltage; connecting to a sense amplifier, a second line connected to the memory cell; charging via the sense amplifier the second line to a predetermined voltage from a second line standby voltage; switching via the control circuit the first line connected to the memory cell from the first voltage to a second voltage; determining via the sense amplifier whether the memory cell has successfully programmed; and switching via the control circuit the first line connected to the memory cell from the second voltage to the first voltage in response to the determining operation. The voltage difference between the first voltage and the predetermined voltage is such that a safe voltage results that does not program the memory cell. The voltage difference between the second voltage and the predetermined voltage is such that a programming voltage operative to program the memory cell results. The switching operations together may create a first pulse.

In a fifth aspect of the invention, a method of programming a two terminal memory cell may be provided. The method may include providing the memory cell; providing a first line connected to the memory cell; providing a first line driver connected to the first line; providing a first line select configured to control the first line driver; providing a control circuit selectively connected to the first line through the first line driver when the first line select is enabled, the control circuit configured to set the first line to a first voltage from a first line standby voltage; providing a second line connected to the memory cell; providing a second line driver connected to the second line; providing a second line select to control the second line driver; and providing a sense amplifier selectively connected to the second line through the second line driver when the second line is enabled, the sense amplifier configured to charge the second line to a predetermined voltage from a second line standby voltage. The control circuit switches the first line from the first voltage to the second voltage. The control circuit may switch the first line from the second voltage to the first voltage. The voltage difference between the first voltage and the predetermined voltage is such that a safe voltage results that does not program the memory cell. The voltage difference between the second voltage and the predetermined voltage is such that a programming voltage operative to program the memory cell results. The switches together may create a first pulse.

In a sixth aspect of the invention, a control circuit and sense amplifier combination operative to program a two terminal memory cell may be provided. The control circuit and sense amplifier combination may include a first line connection outputting a first voltage; and a second line connection outputting a predetermined voltage. The first line connection may be switched to output a second voltage. The first line connection may then be switched to output the first voltage. The voltage difference between the first voltage and the predetermined voltage is such that a safe voltage results that does not program the memory cell. The voltage difference between the second voltage and the predetermined voltage is such that a programming voltage operative to program the memory cell results. The switching the first line connection to output the second voltage and the switching the first line connection to a first voltage together may create a first pulse.

In a seventh aspect of the invention, a memory array including a two terminal memory cell may be provided. The memory array may include a memory cell; a first line connected to the memory cell being set to a first voltage from a first line standby voltage; and a second line connected to the memory cell being charged to a predetermined voltage from a second line standby voltage. The first line may be switched from the first voltage to a second voltage. The first line may then be switched from the second voltage to the first voltage. The voltage difference between the first voltage and the predetermined voltage is such that a safe voltage results that does not program the memory cell. The voltage difference between the second voltage and the predetermined voltage is such that a programming voltage operative to program the memory cell results. The switching of the first line to the second voltage and the switching of the first line to the first voltage together may create a first pulse.

In accordance with an eighth aspect of the invention, a memory array including a two terminal memory cell may be provided. The memory array may include the memory cell; a first line connected to the memory cell; a first line driver connected to the first line; a first line select configured to control the first line driver; a control circuit selectively connected to the first line driver through the first line when the first line select is enabled, the control circuit configured to set the first line to a first voltage from a first line standby voltage; a second line connected to the memory cell; a second line driver connected to the second line; a second line select configured to control the second line driver; and a sense amplifier selectively connected to the second line through the second line driver when the second line select is enabled, the sense amplifier configured to charge the second line to a predetermined voltage from a second line standby voltage. The control circuit may switch the first line from the first voltage to a second voltage. The control circuit may then switch the first line from the second voltage to the first voltage. The voltage difference between the first voltage and the predetermined voltage is such that a safe voltage results that does not program the memory cell. The voltage difference between the second voltage and the predetermined voltage is such that a programming voltage operative to program the memory cell results. The switching the first line from the first voltage to the second voltage and from the second voltage to the first voltage together may create a first pulse.

Other features and aspects of the present invention will become more fully apparent from the following detailed description, the appended claims and the accompanying drawings.

DETAILED DESCRIPTION

Figure 1:
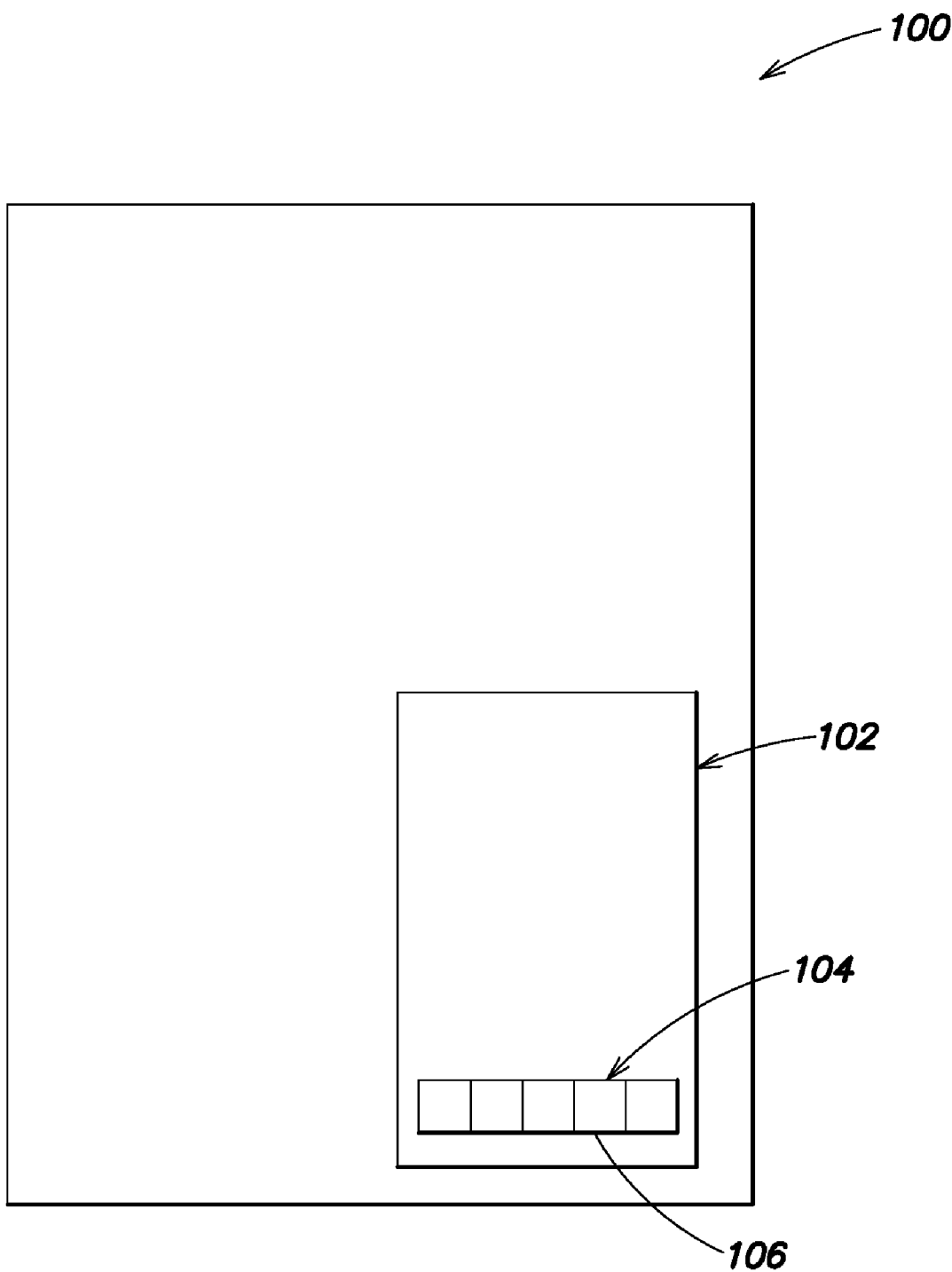
FIG. 1 is a schematic representation of an electronic device according to an embodiment of the present invention.

Reference will now be made in detail to embodiments of the present invention, examples of which are illustrated in the accompanying drawings, wherein like reference numerals refer to the like elements throughout. The embodiments are described below to explain the present invention by referring to the figures.

As used herein, the terms "a", "an" and "the" may refer to one or more than one of an item. The terms "and" and "or" may be used in the conjunctive or disjunctive and will generally be understood to be equivalent to "and/or". For brevity and clarity, a particular quantity of an item may be described or shown while the actual quantity of the item may differ.

Initially, it should be noted that the term voltage as used throughout this specification including the claims, should be broadly interpreted to include the phrase "programming energy".

In accordance with embodiments of the present invention, voltages of both a bit line and a word line may be adjusted to create short programming pulses to program a memory cell. Voltages of the bit line and the word line may initially be at standby voltages. A word line may be switched from a first voltage to a second voltage and then back to the first voltage. The first voltage (e.g., 3 volts) may be such that relative to a voltage applied to the bit line (e.g., 8 volts), a net voltage (e.g., 5 volts) results that is less than a voltage needed to program the memory cell. That is, the first voltage may result in a safe voltage that does not cause the cell to be programmed. Using the voltage of the word line to adjust the net voltage to be less than a voltage that may program the memory cell is counterintuitive in that conventionally the voltage of the bit line is used to control the net voltage. The second voltage (e.g., 0 volts) may be such that relative to a voltage applied to the bit line (e.g., 8 volts), a net voltage (e.g., 8 volts) results that is effective to program the memory cell. That is, the second voltage may result in a programming voltage that does cause the cell to be programmed. The switching from the first voltage to the second voltage and then back to the first voltage may create a short programming pulse. Multiple short programming pulses may be created (i.e., the voltage of the word line may be modulated). By switching from the safe voltage to the programming voltage (e.g., instead of switching from the standby voltage to the programming voltage), a much smaller voltage change may be used during programming that does not require the current to be limited.

FIG. 1 is a schematic representation of an electronic device 100 according to an embodiment of the present invention. The electronic device 100 may include an integrated circuit 102. The integrated circuit 102 may include a memory array 104. The memory array 104 may include a memory cell 106. The memory cell 106 is shown as part of the memory array 104 which is shown as part of the integrated circuit 102 which is shown as part of the electronic device 100. However, the electronic device 100 may otherwise access memory cells 106.

The electronic device 100 may include any of a variety of known or later-developed electronic devices that include or access memory cells 106. For example and not by way of limitation, the electronic device 100 may include a flash drive, a digital audio player, or a portable computer.

Figure 2A:
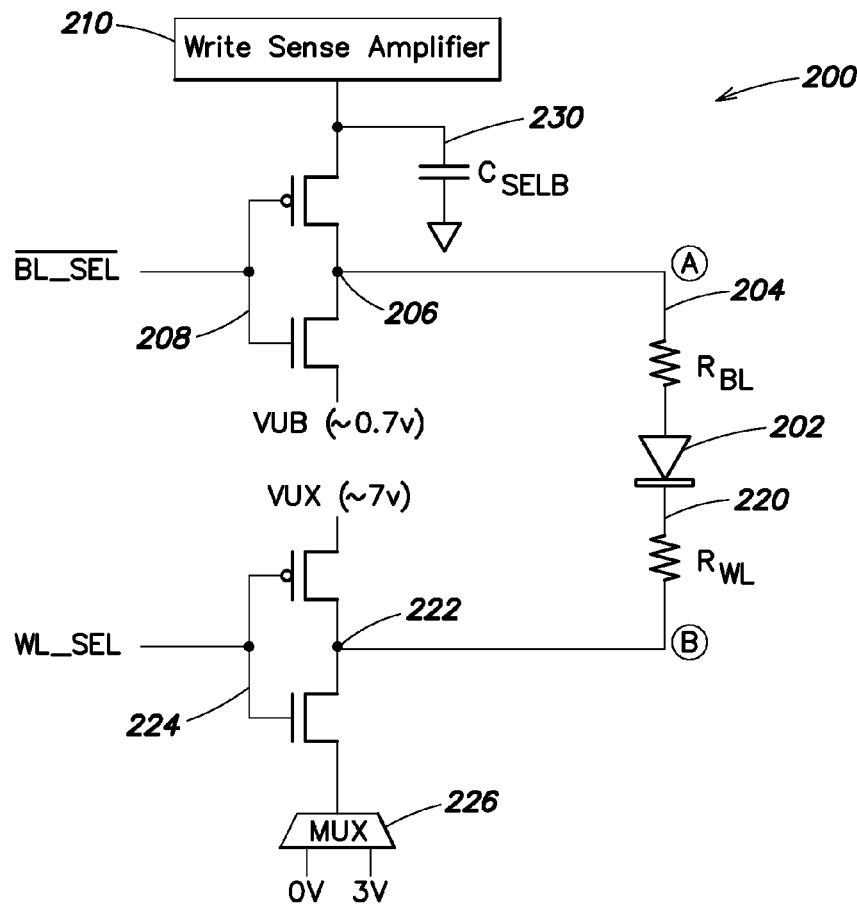
FIG. 2A is a schematic representation of a memory array.

FIG. 2A is a schematic representation of a memory array 200, such as the memory array 104 of FIG. 1. The memory array 200 may include a memory cell 202, a bit line 204, a bit line driver 206, a bit line select 208, a sense amplifier 210, a word line 220, a word line driver 222, a word line select 224, a control circuit 226, and a capacitor 230.

The memory cell 202 may be formed of any of a variety of known or later-developed materials. For example and not by way of limitation, the memory cell 202 may be formed of chalcogenide/PVM or chalcogenide-type materials. The memory cell 202 may be a two-terminal memory cell. The memory cell 202 may include an isolation unit. The isolation unit may include a diode including an anode and a cathode. The anode side may be sensed. The cathode side may be controlled. Alternatively, the anode side may be controlled, and the cathode side may be sensed.

The memory cell 202 may be connected to the bit line 204. The bit line 204 may be on the anode side of the memory cell 202. That is, the bit line may be on the sensed side. The bit line 204 may be long relative to the word line 220. The bit line 204 may be connected to the bit line driver 206. The bit line driver 206 may be controlled by the bit line select 208. When the bit line select 208 is enabled, the bit line 204 may be connected to the sense amplifier 210. The bit line driver 206 may be enabled or disabled based on a charge of the capacitor 230.

The memory cell 202 may be connected to the word line 220. The word line 220 may be on the cathode side of the memory cell 202. That is, the word line may be on the side that is controlled. The word line 220 may be connected to the word line driver 222. The word line driver 222 may be controlled by the word line select 224. When the word line select 224 is enabled, it may connect the word line 220 to the control circuit 226. The word line 220 may be shorted together with another word line so that word lines are shared.

The sense amplifier 210 may be a write sense amplifier. As will be described further below, the sense amplifier 210 may control programming of the memory cell 202 in conjunction with the control circuit 226.

The control circuit 226 may include a dedicated regulator (e.g., a MUX). The control circuit 226 may control the amount of voltage applied to the word line 220. The control circuit 226 may switch between two voltages.

It should be noted that the word line and bit line may be switched between more than two voltages, such as from standby voltages to, for example, a first voltage and to a second voltage. Examples of standby voltages are described in U.S. Pat. Nos. 6,822,903 and 6,963,504, both to Scheuerlein and Knall, and both entitled "APPARATUS AND METHOD FOR DISTURB-FREE PROGRAMMING OF PASSIVE ELEMENT MEMORY CELLS", both of which are incorporated by reference herein in their entirety for all purposes. In these examples, first and second array lines may be driven to selected bias voltages. Then, the first and second array lines may be driven to unselected bias voltages. The timing of when the first and second array lines may be driven to selected bias voltages and when the first and second array lines may be driven to unselected bias voltages may be adjusted relative to one another (i.e., the first array line relative to the second array line), for example, to prevent unintended programming of cells located near target cells in an array. It should be appreciated that in the present disclosure, such standby voltages should not be confused with the first voltage (i.e., as discussed below, the voltage that, when coupled with the voltage applied to the bit line, results in a safe voltage).

The first voltage (e.g., 3 volts) may be high enough that when coupled with voltage applied to the bit line 204 (e.g., 8 volts), may result in a net voltage (e.g., 5 volts) that may be less than a voltage that may program the memory cell 202. That is, the first voltage may result in a safe voltage. The second voltage (e.g., 0 volts) may be low enough that when coupled with voltage applied to the bit line 204 (e.g., 8 volts), may result in a net voltage (e.g., 8 volts) effective to program the memory cell 202. That is, the second voltage may result in a programming voltage.

Alternatively, the control circuit 226 may include a diode connected NMOS device and a bypass path. The diode connected NMOS device may provide the first voltage (i.e., the safe voltage). The bypass path, when selected, may provide the second voltage (resulting in the programming voltage).

The actual value of the first and second voltages may be determined based upon multiple considerations. One consideration may be that the difference between the two voltages should be sufficient to distinguish between programming and not programming. Another consideration may be that the smaller the difference between the two voltages is, the faster the programming of the memory cell 202 may be.

Figure 2B:
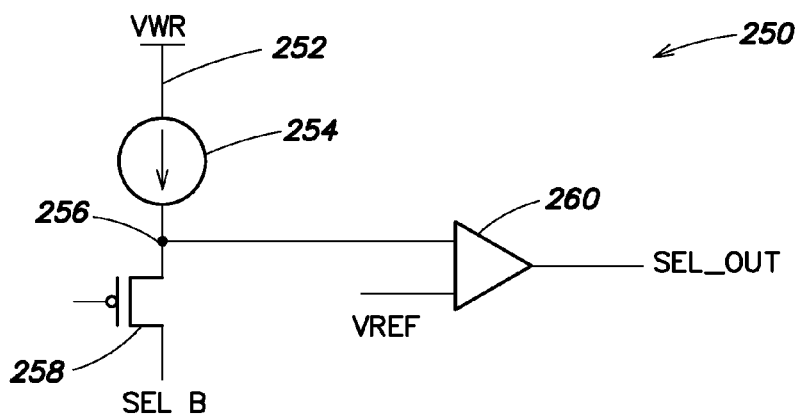
FIG. 2B is a schematic representation of a sense amplifier.

FIG. 2B is a schematic representation of a sense amplifier 250, such as the sense amplifier 210 of FIG. 2A. The sense amplifier 250 may be a write sense amplifier. The sense amplifier 250 may control programming of the memory cell 202 in conjunction with the control circuit 226. The sense amplifier 250 may include a voltage 252, a current limiter 254, a node 256, a pMOS 258, and a voltage reference 260.

The voltage 252 may flow through the current limiter 254, the node 256, and the pMOS 258. The current limit may limit to a predetermined amount (e.g., 1 microamp). The voltage 252 may be compared with the voltage reference 260. Once the memory cell 202 programs, the voltage 252 flowing through the node 256 may fall.

The operation of the memory array 200 is now described with reference to FIGS. 3-7, which illustrate, inter alia, exemplary methods of creating short program pulses.

Figure 3:
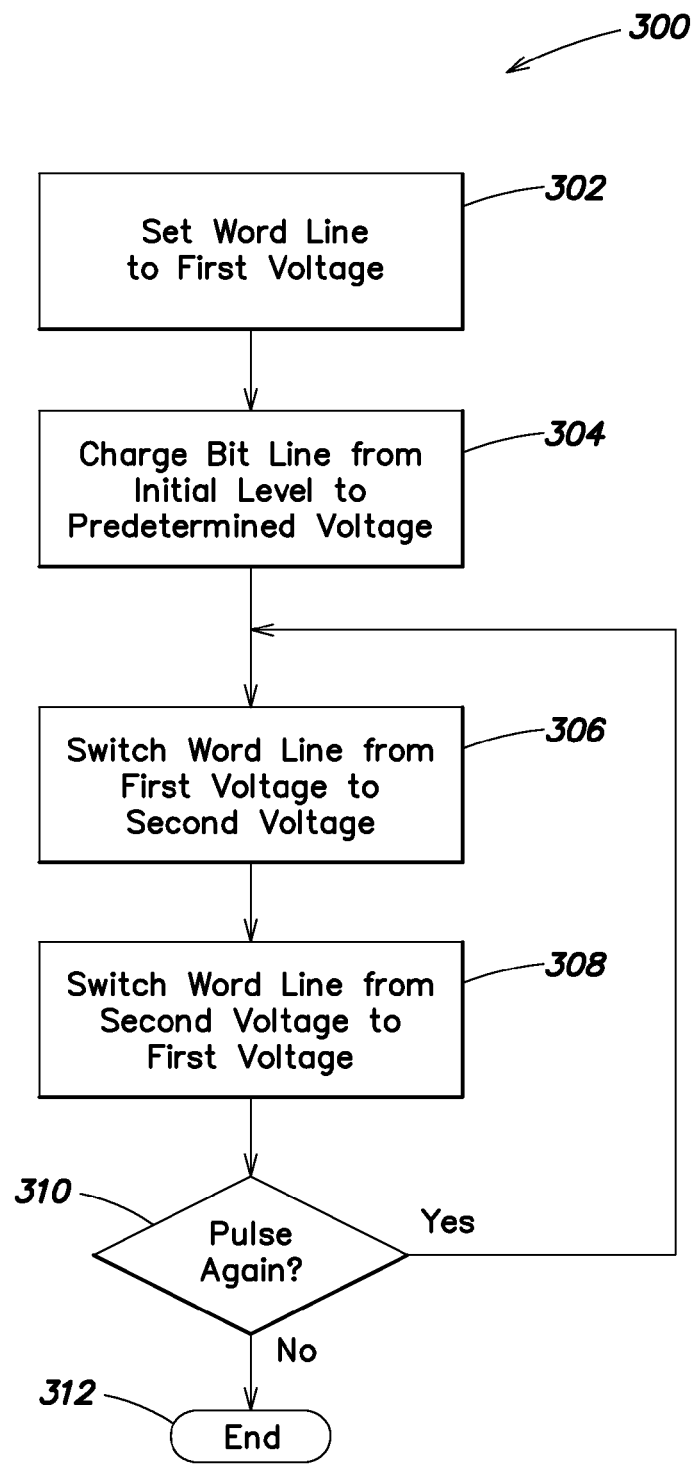
FIG. 3 is a flowchart of a first exemplary open-loop method of creating short program pulses.
Figure 4:
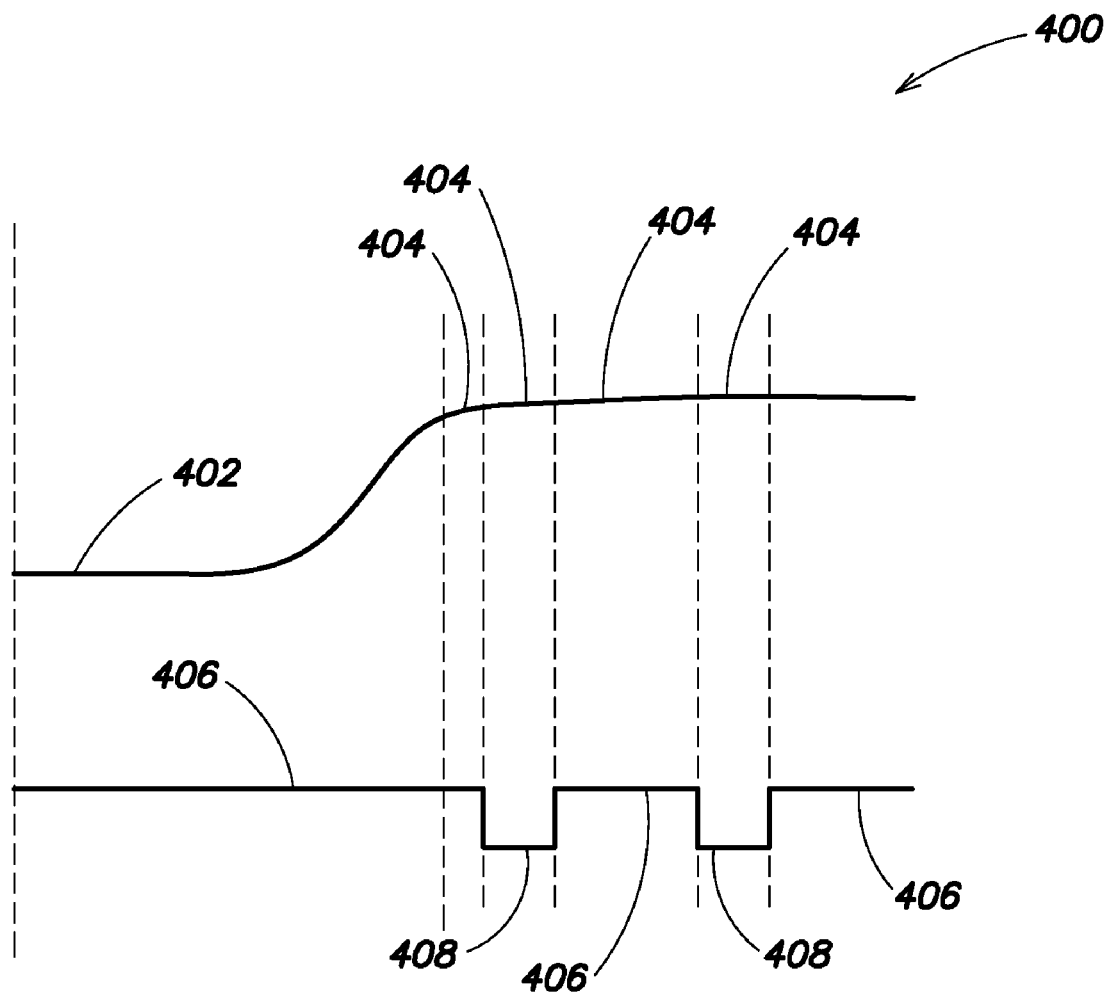
FIG. 4 is a schematic representation of voltages of a bit line and a word line according to an embodiment of the present invention.

FIG. 3 is a flowchart of a first exemplary open-loop method 300 of creating short program pulses. FIG. 4 is a schematic representation of voltages 400 of a bit line 204 and a word line 220 according to an embodiment of the present invention.

In operation 302, the word line 220 may be set to a first voltage 406. For example and not by limitation, the voltage of the word line 220 may be set to 3 volts. The word line select 224 may be enabled thereby connecting the word line 220 through the word line driver 222 to the control circuit 226.

In operation 304, the bit line 204 may be charged from an initial level 402 to a predetermined voltage 404. For example and not by limitation, the bit line 204 may be charged from an initial level of 0 volts to a predetermined voltage of 8 volts.

The bit line 204 may be charged from the initial level 402 to the predetermined voltage 404 quickly and without limitation (e.g., without limiting the amount of current flow). The bit line select 208 may be enabled thereby connecting the bit line 204 through the bit line driver 206 to the sense amplifier 210.

The first voltage 406 of the word line (e.g., 3 volts) may be high enough that when the cell is coupled to the first voltage 406 and the predetermined voltage 404 of the bit line 204 (e.g., 8 volts), a net voltage (e.g., 5 volts) may result that is less than a voltage needed to program the memory cell 202. That is, the first voltage 406 may result in a safe voltage.

In operation 306, the word line 220 may be switched from the first voltage 406 to a second voltage 408. The second voltage (e.g., 0 volts) may be low enough that when the second voltage and the predetermined voltage 404 applied to the bit line 204 (e.g., 8 volts) are coupled to the memory cell a net voltage (e.g., 8 volts) operative to program the memory cell 202 may result. That is, the second voltage 408 may result in a programming voltage. The control circuit 226 may switch between the first voltage 406 and the second voltage 408.

As noted above, the bit line 204 may be long relative to the word line 220. Thus, the switching of the word line 220 may be faster than if the bit line 204 were switched or otherwise controlled.

In operation 308, the word line 220 may be switched from the second voltage 408 to the first voltage 406. Operations 306 and 308 therefore together may create a short programming pulse.

In operation 310, a determination may be made whether to again create a short programming pulse. If it is determined that a short programming pulse should again be created, the open-loop method 300 may return to operation 306, and proceed through operations 306 and 308 to create a short programming pulse. This process may be repeated to create an appropriate number of short programming pulses. If, during operation 310, it is determined that a short programming pulse should not again be created, the open-loop method 300 may proceed to operation 312 and end.

It should be noted that although FIG. 3 shows the determination of whether to again create a short programming pulse after the previous creation of a short programming pulse, the determination, like other operations, may be made at a different point during the open-loop method 300. However, for brevity and clarity, operation 310 is shown as following operation 308.

Figure 5:
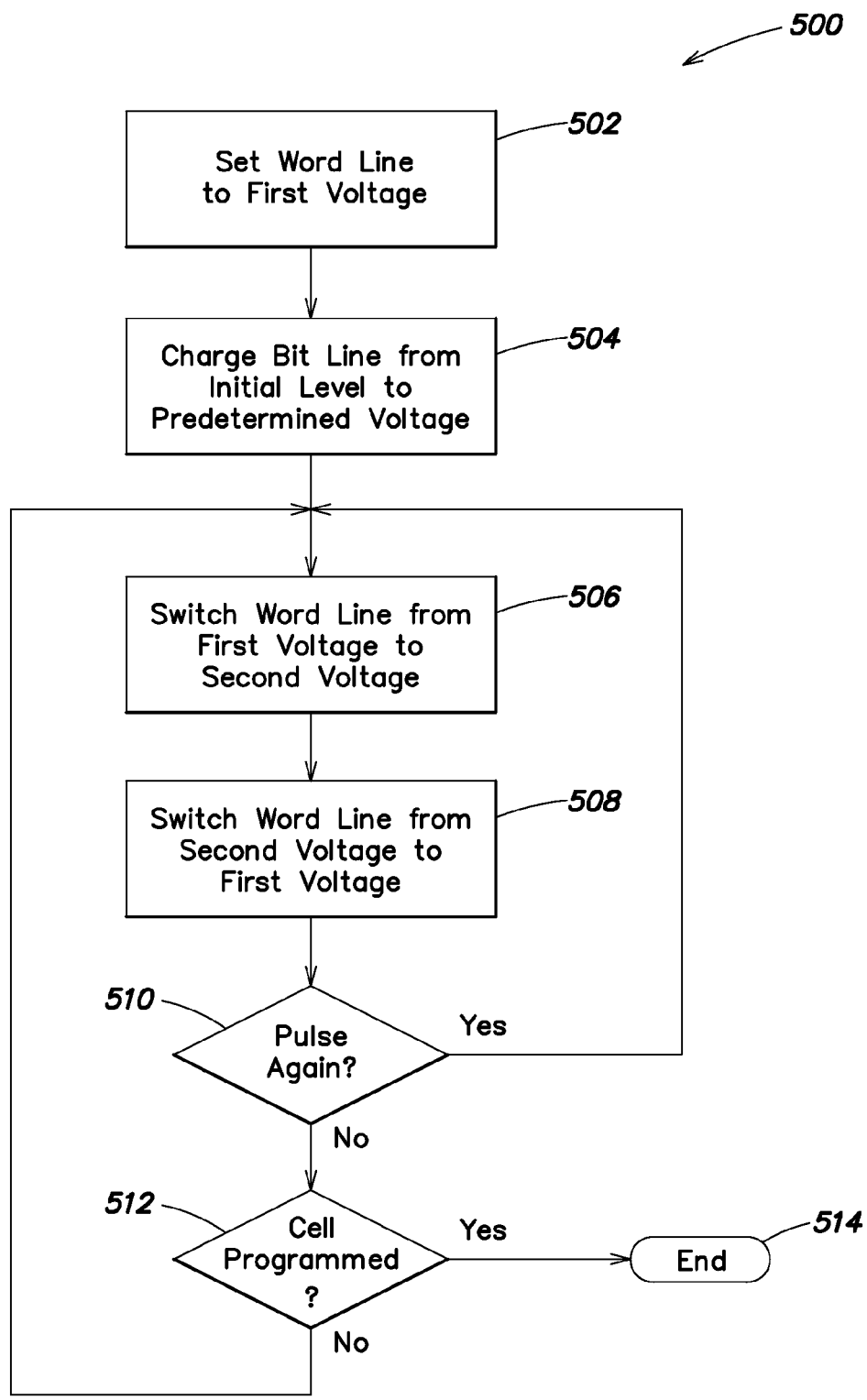
FIG. 5 is a flowchart of a second open-loop method of creating short program pulses.

FIG. 5 is a flowchart of a second open-loop method 500 of creating short program pulses.

In operation 502, the word line 220 may be set to a first voltage 406. For example and not by limitation, the voltage of the word line 220 may be set to 3 volts.

In operation 504, the bit line 204 may be charged from an initial level 402 to a predetermined voltage 404. For example and not by limitation, the bit line 204 may be charged from an initial level of 0 volts to a predetermined voltage of 8 volts. The bit line 204 may be charged from the initial level 402 to the predetermined voltage 404 quickly and without limitation.

In operation 506, the word line 220 may be switched from the first voltage 406 to a second voltage 408.

In operation 508, the word line 220 may be switched from the second voltage to the first voltage 406. Operations 506 and 508 therefore together may create a short programming pulse.

In operation 510, a determination may be made whether to again create a short programming pulse. If it is determined that a short programming pulse should again be created, the open-loop method 500 may return to operation 506, and proceed through operations 506 and 508 to create a short programming pulse. If during operation 510, it is determined that a short programming pulse should not again be created, the open-loop method 500 may proceed to operation 512.

In operation 512, a determination may be made whether the memory cell 202 has been successfully programmed. If it is determined that the memory cell 202 has not been successfully programmed, the open-looped method 500 may return to operation 506, and proceed through operations 506 and 508 to create a short programming pulse. If, during operation 512, it is determined that the memory cell 202 has been successfully programmed, the open-looped method 500 may proceed to operation 514 and end.

It should be noted that although FIG. 5 shows the determinations of whether to again create a short programming pulse and whether the memory cell has been successfully programmed after the previous creation of a short programming pulse, the determinations, like other operations, may be made at a different point during the open-loop method 500, and differently relative to one another. However, for brevity and clarity, operations 510 and 512 are shown as following operation 508.

Figure 6:
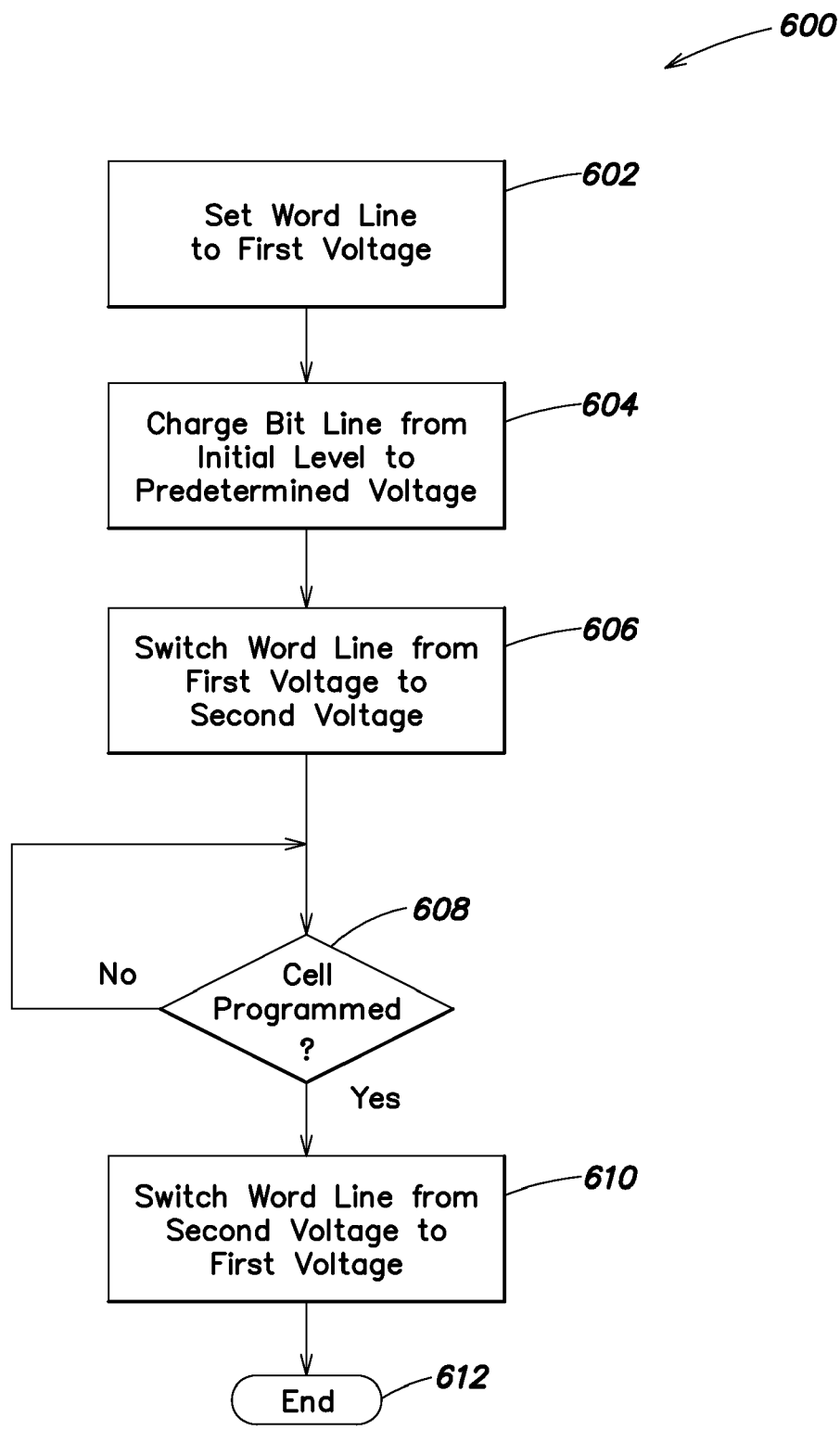
FIG. 6 is a flowchart of an exemplary closed-loop method of creating short program pulses.
Figure 7:
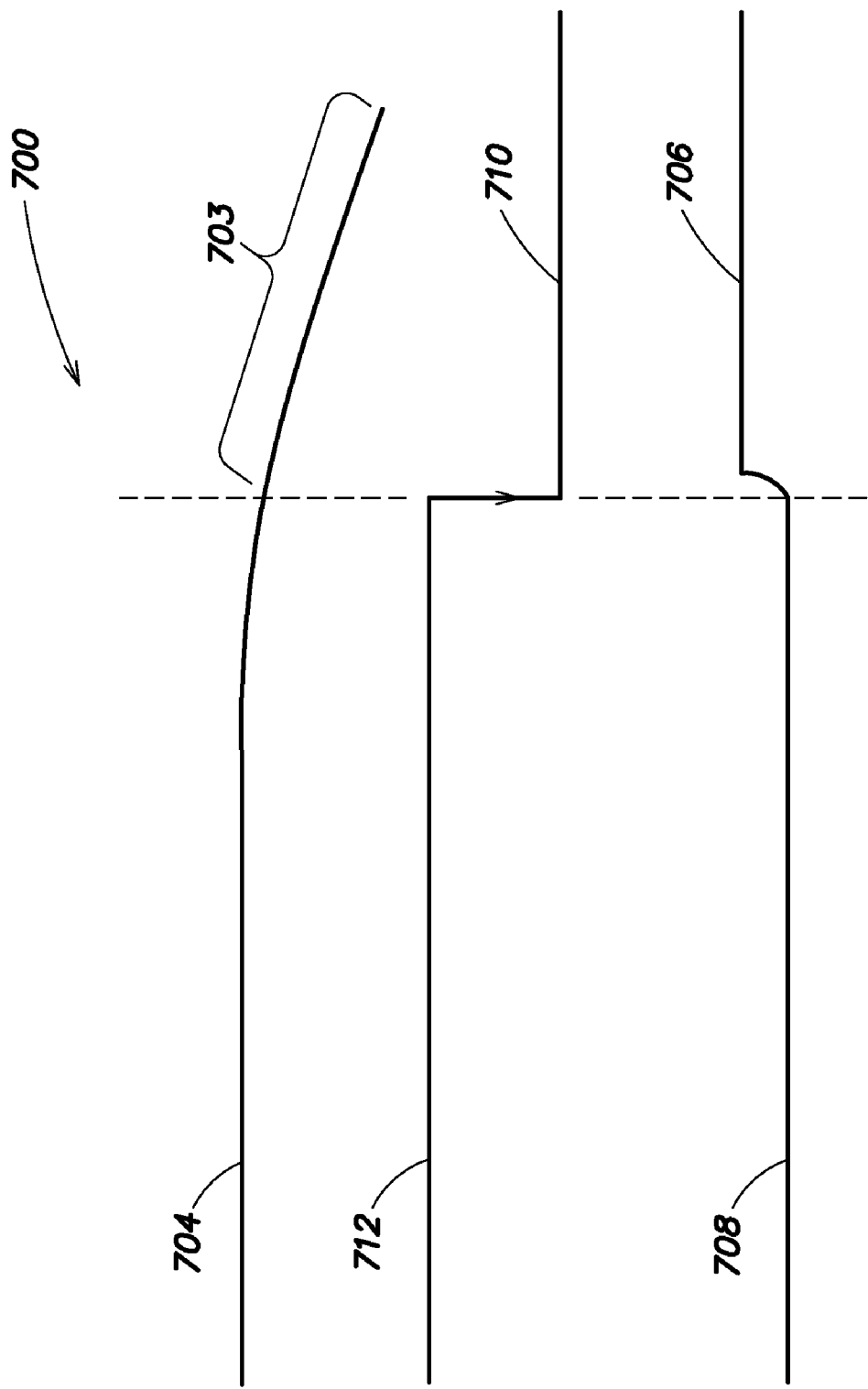
FIG. 7 is a schematic representation of voltages of a bit line, a word line, and a sense amplifier according to an embodiment of the present invention.

FIG. 6 is a flowchart of an exemplary closed-loop method 600 of creating short program pulses. FIG. 7 is a schematic representation of voltages 700 of a bit line 204, a word line 220, and a sense amplifier 210 according to an embodiment of the present invention.

In operation 602, the word line 220 may be set to a first voltage (e.g., first voltage 406 in FIG. 4). For example and not by limitation, the voltage of the word line 220 may be set to 3 volts.

In operation 604, the bit line 204 may be charged from an initial level (e.g., initial level 402 in FIG. 4) to a predetermined voltage 704. For example and not by limitation, the bit line 204 may be charged from an initial level of 0 volts to a predetermined voltage of 8 volts. The bit line 204 may be charged from the initial level 402 to the predetermined voltage quickly and without limitation.

In operation 606, the word line 220 may be switched from the first voltage to a second voltage 708.

In operation 608, a determination may be made whether the memory cell 202 has been successfully programmed. The determination of operation 608 may be made based on a switch from a first voltage 712 of the sense amplifier 210 to a second voltage 710. Upon this switch, predetermined voltage 704 may drop 703. If it is determined that the memory cell 202 has not been successfully programmed, the closed-loop method 600 may return to operation 608 and proceed to determine whether the memory cell 202 has been successfully programmed. If, during operation 608 it is determined that the memory cell 202 has been successfully programmed, the closed-loop method 600 may proceed to operation 610.

In operation 610, the word line 220 may be switched from the second voltage 708 to the first voltage 706.

In operation 612, the closed-looped method 600 may end.

The foregoing description discloses only exemplary embodiments of the invention. Modifications of the above-disclosed embodiments of the present invention of which fall within the scope of the invention will be readily apparent to those of ordinary skill in the art. For instance, although in some embodiments, certain operations are shown as occurring at particular times relative to other operations, the operations may occur at other times.

Accordingly, while the present invention has been disclosed in connection with exemplary embodiments thereof, it should be understood that other embodiments may fall within the spirit and scope of the invention as defined by the following claims.

The invention claimed is:

1. A method of programming a two terminal memory cell, comprising:
   setting a first line connected to the memory cell to a first voltage from a first line standby voltage;
   setting a second line connected to the memory cell to a predetermined voltage from a second line standby voltage;
   switching the first line connected to the memory cell from the first voltage to a second voltage; and
   switching the first line connected to the memory cell from the second voltage to the first voltage,
   wherein a difference between the first voltage and the predetermined voltage results in a safe voltage that does not program the memory cell,
   wherein a difference between the second voltage and the predetermined voltage results in a programming voltage operative to program the memory cell, and
   wherein the switching operations together create a first pulse.

2. The method of claim 1, further comprising, after the switching operations, determining whether to repeat the switching operations to create a second pulse.

3. The method of claim 2, further comprising repeating the switching operations after the determining operation to create the second pulse in response to the determining operation.

4. The method of claim 1, further comprising, after the switching operations, determining whether the memory cell successfully programmed.

5. The method of claim 4, further comprising repeating the switching operations after the determining operation to create a second pulse in response to the determining operation.

6. The method of claim 4, wherein the determining operation includes reading the memory cell to confirm whether the memory cell successfully programmed.

7. The method of claim 2, further comprising, after the switching operations, determining whether the memory cell successfully programmed.

8. The method of claim 7, further comprising:
   repeating the switching operations after the determining whether to repeat the switching operations operation to create the second pulse in response to the determining operation; and
   repeating the switching operations after the determining whether the memory cell successfully programmed operation to create a third pulse in response to the determining operation.

9. The method of claim 8, wherein the operation of repeating the switching operations after determining whether to repeat the switching operations occurs before the operation of repeating the switching operations after the determining whether the memory cell successfully programmed operation.

10. The method of claim 1, wherein the first line comprises a word line and the second line comprises a bit line.

11. The method of claim 1, wherein the first voltage is higher than the second voltage.

12. The method of claim 1, wherein a difference between the safe voltage and the programming voltage is operative to maximize programming speed and operative to distinguish between programming and not programming.

13. The method of claim 1, wherein setting the second line to the predetermined voltage includes charging the second line to the predetermined voltage without limitation.

14. The method of claim 1, wherein the switching from the first voltage to the second voltage includes a VT drop.

15. A method of programming a two terminal memory cell, comprising:
   setting a first line connected to the memory cell to a first voltage from a first line standby voltage;
   setting a second line connected to the memory cell to a predetermined voltage from a second line standby voltage;
   switching the first line connected to the memory cell from the first voltage to a second voltage;
   determining whether the memory cell has successfully programmed; and
   switching the first line connected to the memory cell from the second voltage to the first voltage in response to the determining operation,
   wherein a difference between the first voltage and the predetermined voltage results in a safe voltage that does not program the memory cell,
   wherein a difference between the second voltage and the predetermined voltage results in a programming voltage operative to program the memory cell, and
   wherein the switching operations together create a first pulse.

16. The method of claim 15, further comprising, after the switching operations, determining whether to repeat the switching operations to create a second pulse.

17. The method of claim 16, further comprising repeating the switching operations after the determining whether to repeat operation to create the second pulse in response to the determining whether to repeat operation.

18. The method of claim 15, wherein the determining whether the memory cell has successfully programmed comprises determining when a sense amplifier voltage switches voltage.

19. The method of claim 15, wherein the first line comprises a word line and the second line comprises a bit line.

20. The method of claim 15, wherein the first voltage is higher than the second voltage.

21. The method of claim 15, wherein a difference between the safe voltage and the programming voltage is operative to maximize programming speed and operative to distinguish between programming and not programming.

22. The method of claim 15, wherein the setting of the second line to the predetermined voltage includes charging the second line to the predetermined voltage without limitation.

23. The method of claim 15, wherein the switching from the first voltage to the second voltage comprises a VT drop.

24. A method of programming a two terminal memory cell, comprising:
   connecting a control circuit to a first line connected to the memory cell;
   setting the first line to a first voltage via the control circuit from a first line standby voltage;
   connecting to a sense amplifier, a second line connected to the memory cell;
   charging via the sense amplifier the second line to a predetermined voltage from a second line standby voltage;
   switching via the control circuit the first line connected to the memory cell from the first voltage to a second voltage; and
   switching via the control circuit the first line connected to the memory cell from the second voltage to the first voltage,
   wherein a difference between the first voltage and the predetermined voltage results in a safe voltage that does not program the memory cell, wherein a difference between the second voltage and the predetermined voltage results in a programming voltage operative to program the memory cell, and wherein the switching operations together create a first pulse.

25. The method of claim 24, further comprising, after the switching operations, determining via the control circuit whether to repeat the switching operations to create a second pulse.

26. The method of claim 25, further comprising repeating the switching operations after the determining operation to create the second pulse in response to the determining operation.

27. The method of claim 24, further comprising, after the switching operations, determining via the control circuit whether the memory cell successfully programmed.

28. The method of claim 27, further comprising repeating the switching operations after the determining operation to create a second pulse in response to the determining operation.

29. The method of claim 27, wherein the determining operation includes reading the memory cell to confirm whether the memory cell successfully programmed.

30. The method of claim 25, further comprising, after the switching operations, determining via the control circuit whether the memory cell successfully programmed.

31. The method of claim 30, further comprising:
repeating the switching operations after the determining whether to repeat the switching operations operation to create the second pulse in response to the determining operation; and
repeating the switching operations after the determining whether the memory cell successfully programmed operation to create a third pulse in response to the determining operation.

32. The method of claim 31, wherein the operation of repeating the switching operations after determining whether to repeat the switching operations occurs before the operation of repeating the switching operations after the determining whether the memory cell successfully programmed operation.

33. The method of claim 24, wherein the first line comprises a word line and the second line comprises a bit line.

34. The method of claim 24, wherein the first voltage is higher than the second voltage.

35. The method of claim 24, wherein a difference between the safe voltage and the programming voltage is operative to maximize programming speed and operative to distinguish between programming and not programming.

36. The method of claim 24, wherein the charging of the second line to the predetermined voltage is without limitation.

37. The method of claim 24, wherein the switching from the first voltage to the second voltage comprises a VT drop.

38. A method of programming a two terminal memory cell, comprising:
connecting a first line to a control circuit wherein the first line is connected to the memory cell;
setting via the control circuit the first line to a first voltage from a first line standby voltage;
connecting a second line to a sense amplifier, wherein the second line is connected to the memory cell;
charging the second line to a predetermined voltage via the sense amplifier from a second line standby voltage;
switching via the control circuit the first line connected to the memory cell from the first voltage to a second voltage;

determining via the sense amplifier whether the memory cell has successfully programmed; and
switching via the control circuit the first line connected to the memory cell from the second voltage to the first voltage in response to the determining operation,
wherein a difference between the first voltage and the predetermined voltage results in a safe voltage that does not program the memory cell,
wherein a difference between the second voltage and the predetermined voltage results in a programming voltage operative to program the memory cell, and
wherein the switching operations together create a first pulse.

39. The method of claim 38, further comprising, after the switching operations, determining via the control circuit whether to repeat the switching operations to create a second pulse.

40. The method of claim 39, further comprising repeating the switching operations after the determining whether to repeat operation to create the second pulse in response to the determining whether to repeat operation.

41. The method of claim 38, wherein the determining whether the memory cell has successfully programmed comprises determining when the sense amplifier voltage switches voltage.

42. The method of claim 38, wherein the first line comprises a word line and the second line comprises a bit line.

43. The method of claim 38, wherein the first voltage is higher than the second voltage.

44. The method of claim 38, wherein a difference between the safe voltage and the programming voltage is operative to maximize programming speed and operative to distinguish between programming and not programming.

45. The method of claim 38, wherein the charging of the second line to the predetermined voltage is without limitation.

46. The method of claim 35, wherein the switching from the first voltage to the second voltage comprises a VT drop.

47. A method of programming a two terminal memory cell, comprising:
providing the memory cell;
providing a first line connected to the memory cell;
providing a first line driver connected to the first line;
providing a first line select configured to control the first line driver;
providing a control circuit selectively connected to the first line through the first line driver when the first line select is enabled, the control circuit configured to set the first line to a first voltage from a first line standby voltage;
providing a second line connected to the memory cell;
providing a second line driver connected to the second line;
providing a second line select to control the second line driver; and
providing a sense amplifier selectively connected to the second line through the second line driver when the second line is enabled, the sense amplifier configured to charge the second line to a predetermined voltage from a second line standby voltage,
wherein the control circuit switches the first line from the first voltage to the second voltage,
wherein the control circuit switches the first line from the second voltage to the first voltage,
wherein a difference between the first voltage and the predetermined voltage results in a safe voltage that does not program the memory cell, wherein a difference between the second voltage and the predetermined voltage results in a programming voltage operative to program the memory cell, and wherein the switches together create a first pulse.

48. The method of claim 47, wherein, after the control circuit switches the first line from the first voltage to the second voltage and from the second voltage to the first voltage, the control circuit determines whether to again switch the first line from the first voltage to the second voltage and from the second voltage to the first voltage to create a second pulse.

49. The method of claim 48, wherein the control circuit switches the first line from the first voltage to the second voltage and from the second voltage to the first voltage to create the second pulse.

50. The method of claim 47, wherein, after the control circuit switches the first line from the first voltage to the second voltage and from the second voltage to the first voltage, the control circuit determines whether the memory cell successfully programmed.

51. The method of claim 50, wherein the control circuit switches the first line from the first voltage to the second voltage and from the second voltage to the first voltage to create a second pulse.

52. The method of claim 50, wherein the control circuit determines whether the memory cell successfully programmed by reading the memory cell to confirm whether the memory cell successfully programmed.

53. The method of claim 48, wherein, after the control circuit switches the first line from the first voltage to the second voltage and from the second voltage to the first voltage, the control circuit determines whether the memory cell successfully programmed.

54. The method of claim 53, wherein, the control circuit switches the first line from the first voltage to the second voltage and from the second voltage to the first voltage to create the second pulse, and the control circuit switches the first line from the first voltage to the second voltage and from the second voltage to the first voltage to create a third pulse.

55. The method of claim 54, wherein the control circuit switches the first line from the first voltage to the second voltage and from the second voltage to the first voltage to create the second pulse before the control circuit switches the first line from the first voltage to the second voltage and from the second voltage to the first voltage to create the third pulse.

56. The method of claim 47, wherein the first line comprises a word line and the second line comprises a bit line.

57. The method of claim 47, wherein the first voltage is higher than the second voltage.

58. The method of claim 47, wherein a difference between the safe voltage and the programming voltage is operative to maximize programming speed and operative to distinguish between programming and not programming.

59. The method of claim 47, wherein the charging of the second line to the predetermined voltage is without limitation.

60. The method of claim 47, wherein the switching from the first voltage to the second voltage comprises a VT drop.

61. The method of claim 47, wherein the sense amplifier is further configured to detect whether the memory cell has successfully programmed, wherein the control circuit switches the first line from the second voltage to the first voltage in response to the sense amplifier determining that the memory cell has been successfully programmed.

62. The method of claim 61, wherein, after the control circuit switches the first line from the first voltage to the second voltage and from the second voltage to the first voltage, the control circuit determines whether to again switch the first line from the first voltage to the second voltage and from the second voltage to the first voltage to create a second pulse.

63. The method of claim 62, wherein the control circuit switches the first line from the first voltage to the second voltage and from the second voltage to the first voltage to create the second pulse.

64. The method of claim 61, wherein the sense amplifier determines that the memory cell has been successfully programmed by detecting when a sense amplifier voltage switches voltage.

65. A control circuit and sense amplifier combination operative to program a two terminal memory cell, comprising:

a first line connection outputting a first voltage; and a second line connection outputting a predetermined voltage;

wherein the first line connection is switched to output a second voltage, wherein the first line connection is then switched to output the first voltage, wherein a difference between the first voltage and the predetermined voltage results in a safe voltage, wherein a difference between the second voltage and the predetermined voltage results in a programming voltage, and wherein the switching the first line connection to output the second voltage and the switching the first line connection to a first voltage together create a first pulse.

66. The control circuit and sense amplifier combination of claim 65, wherein, after the first line connection is switched from outputting the first voltage to output the second voltage and from outputting the second voltage to output the first voltage, the control circuit and sense amplifier combination determines whether to again switch the first line connection from outputting the first voltage to output the second voltage and from outputting the second voltage to output the first voltage to create a second pulse.

67. The control circuit and sense amplifier combination of claim 66, wherein the control circuit and sense amplifier combination switches the first line connection from outputting the first voltage to output the second voltage and from outputting the second voltage to outputting the first voltage to create the second pulse.

68. The control circuit and sense amplifier combination of claim 65, wherein after the first line connection is switched from outputting the first voltage to output the second voltage and from outputting the second voltage to output the first voltage, the control circuit and sense amplifier combination determines whether a memory cell successfully programmed.

69. The control circuit and sense amplifier of claim 68, wherein the control circuit and sense amplifier combination switches the first line connection from outputting the first voltage to output the second voltage and from outputting the second voltage to outputting the first voltage to create a second pulse.

70. The control circuit and sense amplifier of claim 68, wherein the control circuit and sense amplifier combination determines whether the memory cell successfully programmed by reading the memory cell to confirm whether the memory cell successfully programmed.

71. The control circuit and sense amplifier combination of claim 66, wherein after the first line connection is switched from outputting the first voltage to output the second voltage and from outputting the second voltage to output the first voltage, the control circuit and sense amplifier combination determines whether a memory cell successfully programmed.

72. The control circuit and sense amplifier combination of claim 71, wherein the control circuit and sense amplifier combination switches the first line connection from outputting the first voltage to output the second voltage and from outputting the second voltage to output the first voltage to create a third pulse.

73. The control circuit and sense amplifier combination of claim 72, wherein the control circuit and sense amplifier combination switches the first line connection from outputting the first voltage to output the second voltage and from outputting the second voltage to outputting the first voltage to create the second pulse before the control circuit and sense amplifier combination switches the first line output from outputting the first voltage to output the second voltage and from outputting the second voltage to output the first voltage to create the third pulse.

74. The control circuit and sense amplifier combination of claim 65, wherein the first line connection includes a word line connection and the second line connection includes a bit line connection.

75. The control circuit and sense amplifier combination of claim 65, wherein the first voltage is higher than the second voltage.

76. The control circuit and sense amplifier combination of claim 65, wherein the switching from the first voltage to the second voltage comprises a VT drop.

77. The control circuit and sense amplifier combination of claim 65, wherein the control circuit and sense amplifier comprises a dedicated regulator.

78. The control circuit and sense amplifier combination of claim 65, wherein the control circuit and sense amplifier includes:
a diode connected NMOS device; and
a bypass path.

79. The control circuit and sense amplifier combination of claim 65, wherein the control circuit and sense amplifier is configured to detect whether the memory cell has successfully programmed, wherein the first line connection is switched to output the first voltage in response to the control circuit and sense amplifier combination detecting that a memory cell has successfully programmed.

80. The control circuit and sense amplifier combination of claim 79, wherein, after the control circuit and sense amplifier combination switches the first line connection from outputting the first voltage to outputting the second voltage and from outputting the second voltage to output the first voltage, the control circuit and sense amplifier combination determines whether to again switch the first line connection from outputting the first voltage to output the second voltage and from outputting the second voltage to output the first voltage to create a second pulse.

81. The control circuit and sense amplifier combination of claim 80, wherein the control circuit and sense amplifier combination switches the first line connection from outputting the first voltage to output the second voltage and from outputting the second voltage to output the first voltage to create the second pulse.

82. The control circuit and sense amplifier combination of claim 79, wherein the control circuit and sense amplifier combination determines that the memory cell has been successfully programmed by detecting when a sense amplifier voltage switches voltage.

83. A memory array including a two terminal memory cell, comprising:
the memory cell;
a first line connected to the memory cell being set to a first voltage from a first line standby voltage; and
a second line connected to the memory cell being charged to a predetermined voltage from a second line standby voltage;
wherein the first line is switched from the first voltage to a second voltage,
wherein the first line is then switched from the second voltage to the first voltage,
wherein a difference between the first voltage and the predetermined voltage results in a safe voltage that does not program the memory cell,
wherein a difference between the second voltage and the predetermined voltage results in a programming voltage operative to program the memory cell, and
wherein the switching of the first line to the second voltage and the switching of the first line to the first voltage together create a first pulse.

84. The memory array of claim 83, wherein, after the first line is switched from the first voltage to the second voltage and from the second voltage to the first voltage, a control circuit determines whether the first line is again switched from the first voltage to the second voltage and from the second voltage to the first voltage to create a second pulse.

85. The memory array of claim 84, wherein the first line is switched from the first voltage to the second voltage and from the second voltage to the first voltage to create the second pulse.

86. The memory array of claim 83, wherein, after the first line is switched from the first voltage to the second voltage and from the second voltage to the first voltage, a sense amplifier determines whether the memory cell successfully programmed.

87. The memory array of claim 86, wherein the first line is switched from the first voltage to the second voltage and from the second voltage to the first voltage to create a second pulse.

88. The memory array of claim 86, wherein sense amplifier determines whether the memory cell successfully programmed by reading the memory cell to confirm whether the memory cell successfully programmed.

89. The memory array of claim 85, wherein, after the first line is switched from the first voltage to the second voltage and from the second voltage to the first voltage, a sense amplifier determines whether the memory cell successfully programmed.

90. The memory array of claim 89, wherein the first line is switched from the first voltage to the second voltage and from the second voltage to the first voltage to create a third pulse.

91. The memory array of claim 90, wherein the first line is switched from the first voltage to the second voltage and from the second voltage to the first voltage to create the second pulse before the first line is switched from the first voltage to the second voltage and from the second voltage to the first voltage to create a third pulse.

92. The memory array of claim 83, wherein the first line includes a word line and the second line includes a bit line.

93. The memory array of claim 83, wherein the first voltage is higher than the second voltage.

94. The memory array of claim 83, wherein the switching from the first voltage to the second voltage comprises a VT drop.

95. The memory array of claim 83, further comprising a control circuit including a dedicated regulator.

96. The memory array of claim 83, further comprising a control circuit, wherein the control circuit includes:
a diode connected NMOS device; and
a bypass path.

97. The memory array of claim 83, wherein a sense amplifier is configured to detect whether the memory cell has successfully programmed, wherein the first line is switched from the second voltage to the first voltage in response to the sense amplifier detecting that the memory cell has successfully programmed.

98. The memory array of claim 97, wherein after the first line is switched from the first voltage to the second voltage and from the second voltage to the first voltage, the first line is switched from the first voltage to the second voltage and from the second voltage to the first voltage to create a second pulse.

99. The memory array of claim 97, wherein the sense amplifier is configured to determine whether the memory cell has successfully programmed by detecting when a sense amplifier voltage switches voltage.

100. The memory array of claim 83, wherein the second line is longer than the first line.

101. The memory array of claim 83, wherein the memory cell comprises chalcogenide.

102. A memory array including a two terminal memory cell, comprising:
   the memory cell;
   a first line connected to the memory cell;
   a first line driver connected to the first line;
   a first line select configured to control the first line driver;
   a control circuit selectively connected to the first line through the first line driver when the first line select is enabled, the control circuit configured to set the first line to a first voltage from a first line standby voltage;
   a second line connected to the memory cell;
   a second line driver connected to the second line;
   a second line select configured to control the second line driver; and
   a sense amplifier selectively connected to the second line through the second line driver when the second line select is enabled, the sense amplifier configured to charge the second line to a predetermined voltage from a second line standby voltage,
   wherein the control circuit switches the first line from the first voltage to a second voltage,
   wherein the control circuit then switches the first line from the second voltage to the first voltage,
   wherein a difference between the first voltage and the predetermined voltage results in a safe voltage that does not program the memory cell,
   wherein a difference between the second voltage and the predetermined voltage results in a programming voltage operative to program the memory cell, and
   wherein the switching the first line from the first voltage to the second voltage and from the second voltage to the first voltage together create a first pulse.

103. The memory array of claim 102, wherein the second line is longer than the first line.

104. The memory array of claim 102, wherein the memory cell comprises chalcogenide.

* * * * *